(12) United States Patent
Liu et al.

(10) Patent No.: US 9,917,069 B2
(45) Date of Patent: Mar. 13, 2018

(54) HYBRID BONDING SYSTEM AND CLEANING METHOD THEREOF

(71) Applicant: TAIWAN SEMICONDUCTOR MANUFACTURING COMPANY LTD., Hsinchu (TW)

(72) Inventors: Ping-Yin Liu, Taipei County (TW); Yeong-Jyh Lin, Nantou County (TW); Xin-Hua Huang, Changhua County (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 105 days.

(21) Appl. No.: 14/674,500

(22) Filed: Mar. 31, 2015

(65) Prior Publication Data

US 2016/0293567 A1    Oct. 6, 2016

(51) Int. Cl.
*B08B 9/20* (2006.01)
*H01L 23/00* (2006.01)
*H01L 21/18* (2006.01)

(52) U.S. Cl.
CPC ............ *H01L 24/75* (2013.01); *H01L 21/187* (2013.01); *H01L 24/80* (2013.01); *H01L 2224/74* (2013.01); *H01L 2224/7501* (2013.01); *H01L 2224/759* (2013.01); *H01L 2224/75801* (2013.01); *H01L 2224/75821* (2013.01);
(Continued)

(58) Field of Classification Search
CPC ......... B08B 1/001; H01L 24/83; H01L 24/75; H01L 2224/7565; H01L 2224/83022; H01L 2224/83908; H01L 24/80; H01L 21/187; H01L 2224/80908; H01L 2224/759; H01L 2224/7501; H01L 2224/80014; H01L 2224/75901; H01L 2224/75801; H01L 2224/75821; H01L 2224/74; H01L 2224/80012; H01L 2224/8001;
(Continued)

(56) References Cited

U.S. PATENT DOCUMENTS

| | | | | |
|---|---|---|---|---|
| 6,260,562 | B1 * | 7/2001 | Morinishi | ......... H01L 21/67051 134/113 |
| 2010/0261332 | A1 | 10/2010 | Kim et al. | |
| 2014/0011324 | A1 * | 1/2014 | Liu | .......................... H01L 24/74 438/107 |

FOREIGN PATENT DOCUMENTS

| | | |
|---|---|---|
| KR | 1020080105956 | 12/2008 |
| KR | 1020080105956 A | 12/2008 |
| KR | 2020140005743 | 11/2014 |

OTHER PUBLICATIONS

Office Action dated Mar. 7, 2017 for the Korea counterpart application 10-2015-0166795, Not in English. Considered to the extent it was understood.

(Continued)

*Primary Examiner* — Eric W Golightly
(74) *Attorney, Agent, or Firm* — WPAT, P.C., Intellectual Property Attorneys; Anthony King

(57) ABSTRACT

A method of cleaning an apparatus for processing a semiconductor wafer includes providing a first device having a first surface configured to load a first semiconductor wafer, a second device having a second surface configured to load a second semiconductor wafer, and a first cleaning module; and cleaning the second surface by moving the first cleaning module across the second surface in a first direction with respect to the second device.

14 Claims, 13 Drawing Sheets

(52) U.S. Cl.
CPC .............. *H01L 2224/75901* (2013.01); *H01L 2224/8001* (2013.01); *H01L 2224/80012* (2013.01); *H01L 2224/80014* (2013.01); *H01L 2224/80908* (2013.01)

(58) Field of Classification Search
CPC ....... H01L 2924/00012; H01L 2224/80; H01L 2924/00014
USPC .......................... 134/25.1, 25.4, 25.5, 34, 37
See application file for complete search history.

(56) References Cited

OTHER PUBLICATIONS

US20100261332A1 corresponds to KR1020080105956A.
English translation and the Notice of Allowance dated Sep. 28, 2017 for corresponding Korean application 10-2015-0166795.

\* cited by examiner

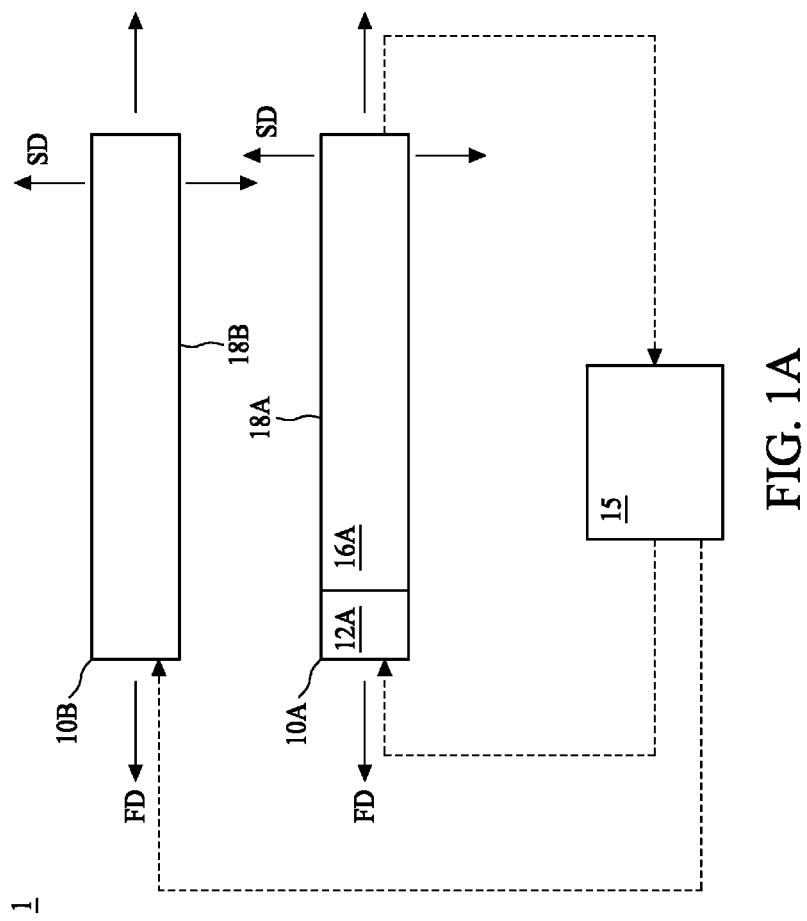

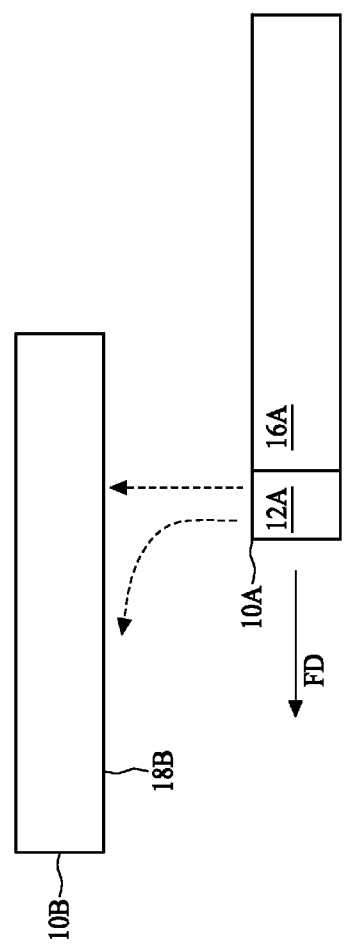

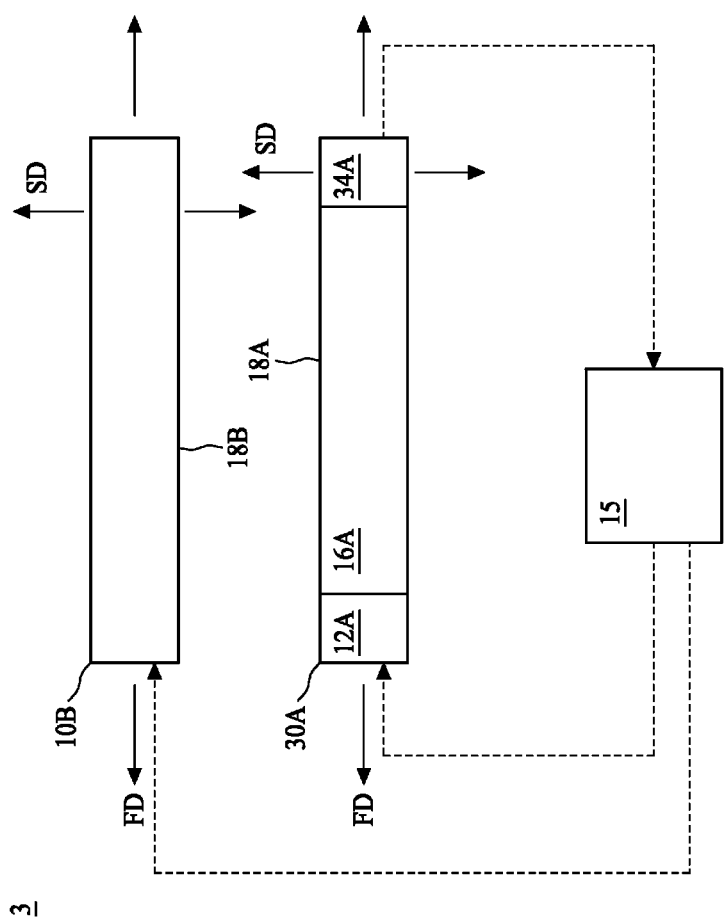

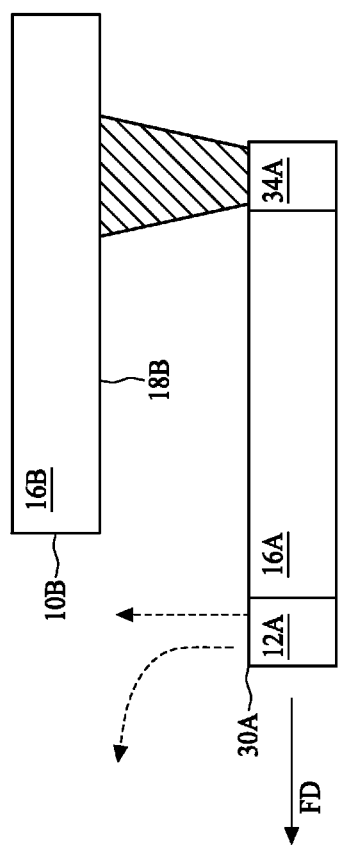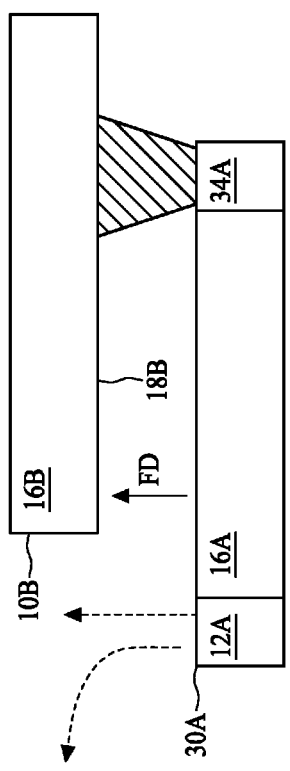

HYBRID BONDING SYSTEM AND CLEANING METHOD THEREOF

BACKGROUND

Semiconductor devices are widely used in a variety of electronic devices, such as laptops, smart phones and tablets. As semiconductor industry continues to thrive, electronic components (e.g., transistors, diodes, resistors, capacitors, etc.) have increasingly smaller feature sizes and hence electronic devices become more and more compact. As a result, more components are allowed to be integrated in a given area.

Due to limitation of Moore's law, three-dimensional integrated circuits (3D ICs) are a recent development in semiconductor packaging, in which multiple semiconductor dies are stacked upon one another. 3D ICs provide enhanced integration density. Hybrid bonding is one type of bonding procedure for 3D ICs, wherein two semiconductor wafers are bonded together using a hybrid bonding technique. In hybrid bonding procedure, however, localized defect may often occur on a surface of a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic diagram of a hybrid bonding system, in accordance with some embodiments.

FIG. 1B is a schematic diagram illustrating a cleaning operation, in accordance with some embodiments.

FIG. 3A is a schematic diagram of a hybrid bonding system, in accordance with some embodiments.

FIG. 3B is a schematic diagram illustrating a capturing operation, in accordance with some embodiments.

FIG. 3C is a schematic diagram illustrating a capturing operation, in accordance with some embodiments.

DETAILED DESCRIPTION

Figure 2:
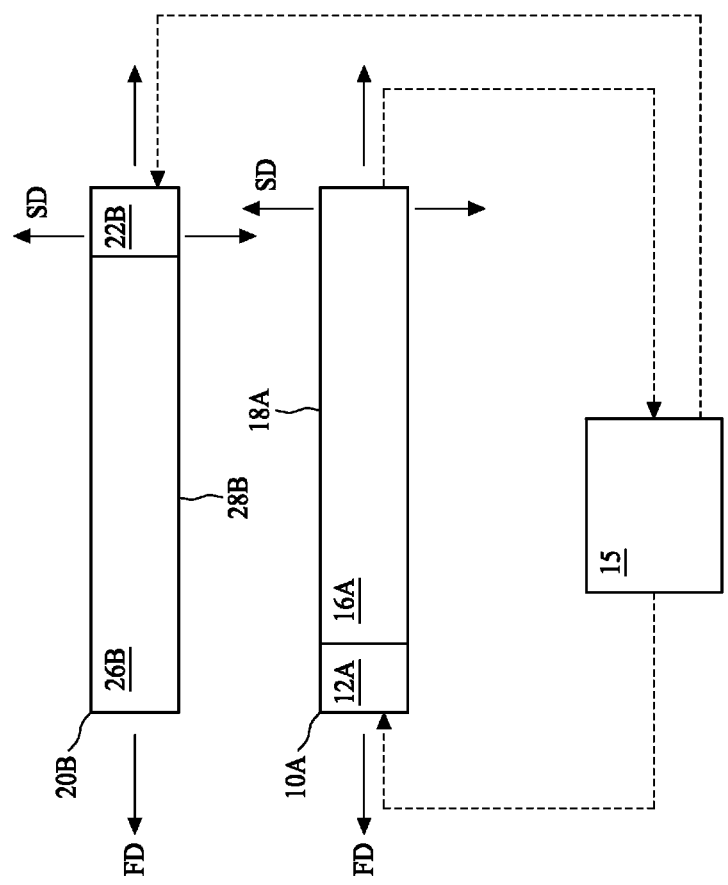
FIG. 2 is a schematic diagram of a hybrid bonding system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, ETC., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", ETC. are used to describe a relationship between a device or a characteristic and another device or another characteristic in the drawing. It should be noted that the space orientation term can cover different orientations of the device besides the orientation of the device illustrated in the drawing.

FIG. 1A is a schematic diagram of a hybrid bonding system 1, in accordance with some embodiments. Referring to FIG. 1A, the hybrid bonding system 1 includes a first device 10A, a second device 10B, and a controller 15. The first device 10A and the second device 10B face to each other, and the controller 15 is electrically coupled to the first device 10A and the second device 10B.

The first device 10A includes a first cleaning module 12A and a first support body 16A. The first cleaning module 12A is configured to clean particles or contamination on a surface 18B of the second device 10B. The cleaning operation will be described and illustrated in detail with reference to FIG. 1B. In some embodiments, the first cleaning module 12A includes air-jets or air-guns, which emit air to clean particles that may incidentally fall on the surface 18B. In other embodiments, the first cleaning module 12A includes ion nozzles, which emit ions with charge to neutralize particles with electrostatic charge. In this way, the particles on the surface 18B of the second device 10B can be easily removed. In some embodiments, the first cleaning module 12A includes an infrared light source or a hot air source, which functions to heat an organic particle on the surface 18B, such that pyrolysis occurs in the organic particle and, therefore, the organic particle can be easily removed. The temperature of the hot air is, for example, higher than approximately 120 degrees Celsius (° C.). In an embodiment, the first cleaning module 12A is detachably mounted to the first device 10A.

In some embodiments, however, the first cleaning module 12A is independent of the first device 10A and may be discretely disposed relative to the first device 10A. The first cleaning module 12A is configured to clean the surface 18B of the second device 10B while moving across the surface 18B in the first direction FD with respect to the second device 10B.

The first support body 16A has a surface 18A. The surface 18A functions to support a semiconductor wafer (not shown) to be bonded. In a hybrid bonding process, the semiconductor wafer on the surface 18A is bonded with a semiconductor wafer on the surface 18B of the second device 10B. In some embodiments, the first support body 16A includes a chuck.

The first device 10A is configured to be movable with respect to the second device 10B. As will be discussed in some embodiments below, the first device 10A can move back and forth in a first direction FD. Moreover, in other embodiments, the first device 10A can also move back and forth in a second direction SD. The first direction FD is different from the second direction SD. For example, the first direction FD is orthogonal to the second direction SD.

Likewise, the second device 10B is also configured to be movable with respect to the first device 10A. In some embodiments, the second device 10B can move back and forth in the first direction FD. In other embodiments, the second device 10B can also move back and forth in the second direction SD. The second device 10B has a surface 18B, which faces the first device 10A. The second device 10B functions to support a semiconductor wafer (not shown) to be bonded. In an embodiment, the second device 10B includes a chuck.

The controller 15 is configured to control at least one of the first device 10A or the second device 10B. In an embodiment, the controller 15 controls the first device 10A to move relative to the second device 10B. For example, the controller 15 controls the first device 10A to move in the first direction FD. Moreover, the controller 15 is configured to control the first cleaning module 12A to clean the surface 18B of the second device 10B. In some embodiments, the controller 15 includes a computer.

In another embodiment, the controller 15 controls the second device 10B to move in the first direction FD. In some embodiments, the controller 15 controls the first device 10A and the second device 10B to move with respect to each other in the first direction FD. In that case, the first device 10A and the second device 10B may move in different directions. For example, the second device 10B moves in the first direction FD as the first device 10A moves in a direction opposite to the first direction FD.

FIG. 1B is a schematic diagram illustrating a cleaning operation, in accordance with some embodiments. Referring to FIG. 1B, the first cleaning module 12A of the first device 10A, when implemented with jet guns, emits an air flow to clean the surface 18B of the second device 10B while the first device 10A moves across the surface 18B in the first direction FD with respect to the second device 10B. In the present embodiment, the second device 10B is kept immobile, while the first device 10A moves along the first direction FD across the surface 18B of the second device 10B. As a result, the first cleaning module 12A may effectively clean the surface 18B. In some embodiments, the second device 10B moves in a reverse direction while the first device 10A is kept immobile. As such, the first cleaning module 12A can also clean the surface 18B. In still some embodiments, the first device 10A and the second device 10B move with respect to each other in the first direction FD during a cleaning operation.

FIG. 2 is a schematic diagram of a hybrid bonding system 2, in accordance with some embodiments. Referring to FIG. 2, the hybrid bonding system 2 is similar to the hybrid bonding system 1 described and illustrated with reference to FIG. 1A except that, for example, the hybrid bonding system 2 includes a second device 20B that includes a second support body 26B and a second cleaning module 22B. The second support body 26B includes a surface 28B configured to support a semiconductor wafer to be bonded, and is configured to perform a function similar to that of the first support body 16A. Moreover, the surface 28B is subject to cleaning by the first cleaning module 12A.

The second cleaning module 22B functions to clean the surface 18A of the first support body 16A. Moreover, the second cleaning module 22B is configured to clean the surface 18A of the first support body 16A in a similar manner to the first cleaning module 12A. In this embodiment, the second cleaning module 22B is configured to clean the first surface 18A of the first device 10A while the second cleaning module 22B moves across the first surface 18A in the first direction FD with respect to the first device 10A. Since the first device 10A and the second device 20B include the first cleaning module 12A and the second cleaning module 22B, respectively, the surface 18A and the surface 28B can be effectively cleaned. In some embodiments, the second cleaning module 22B is detachably mounted to the second device 20B.

In some embodiments, however, the second cleaning module 22B is independent of the second device 20B and may be discretely disposed relative to the second device 20B. The second cleaning module 22B is configured to clean the surface 18A of the first device 10A while moving across the surface 18A in the first direction FD with respect to the first device 10A.

FIG. 3A is a schematic diagram of a hybrid bonding system 3, in accordance with some embodiments. Referring to FIG. 3A, the hybrid bonding system 3 is similar to the hybrid bonding system 1 described and illustrated with reference to FIG. 1A except that, for example, the hybrid bonding system 3 includes a first device 30A that includes a first image capturing module 34A. The first image capturing module 34A, the first support body 16A and the first cleaning module 12A are arranged sequentially substantially along the first direction FD. In the present embodiment, the first support body 16A is disposed between the first cleaning module 12A and the first image capturing module 34A. Moreover, the first cleaning module 12A is arranged at the left side of the first device 30A, while the first image capturing module 34A is arranged at the right side of the first device 30A. In some embodiments, the first capturing module 34A and the first cleaning module 12A may be arranged on the same side of the first device 30A.

In order to inspect whether there is any particle on the surface 18B after the cleaning process, the first image capturing module 34A functions to capture an image of the surface 18B of the second device 10B. The capturing operation will be described in detail with reference to FIGS. 3B and 3C. In some embodiments, the first image capturing module 34A includes an ultraviolet (UV) light source, which emits UV light with a wavelength range of approximately 10 nanometer (nm) to 400 nm. In other embodiments, the first image capturing module 34A includes a visible light source, which emits visible light with a wavelength range of approximately 420 nm to 470 nm. The image of the particles becomes clearer as the wavelength is shorter enough. In some embodiments, the first image capturing module 34A includes a laser beam light source, which emits a laser beam. In still some embodiments, the first image capturing module 34A includes a charge-coupled device (CCD), which senses the light reflected from the surface 18B of the second device 10B so as to capture an image from the surface 18B. In the present embodiment, the first image capturing module 34A is detachably mounted to the first device 10A.

In some embodiments, however, the first image capturing module 34A is independent of the first device 30A and may be discretely disposed relative to the first device 30A. The first image capturing module 34A is configured to capture the image of the surface 18B while moving across the surface 18B in the first direction FD with respect to the second device 10B.

The controller 15 receives an image information from the first image capturing module 34A, analyzes the image information and, based on the analysis result, controls the first cleaning module 12A. For example, the controller 15 controls the first cleaning module 12A to keep cleaning the surface 18B until the image information received indicates no particle on the surface 18B.

FIG. 3B is a schematic diagram illustrating a capturing operation, in accordance with some embodiments. Referring to FIG. 3B, the first image capturing module 34A is configured to capture an image of the surface 18B of the second device 10B while the first image capturing module 34A moves across the surface 18B in the first direction FD with respect to the second device 10B. As the first device 30A moves across the surface 18B in the first direction FD, the first cleaning module 12A cleans the surface 18B, and the first image capturing module 34A captures an image of the surface 18B that has been cleaned.

If the controller 15, based on the captured image, determines that there is a particle on the surface 18B, the controller 15 keeps activating the first device 30A. Subsequently, the first device 30A moves in a direction opposite to the first direction FD and returns to the place where the first device 30A is originally positioned. During the return trip of the first device 30A, the first cleaning module 12A keeps cleaning the surface 18B from the left side of the second device 10B to the right side of the second device 10B, and the first image capturing module 34A keeps capturing an image of the surface 18B. In some embodiments, the first device 30A keeps performing such cleaning and image capturing operations mentioned above until no particle is found on the surface 18B. The hybrid bonding system 3 is not stopped for manual operation unless a particle cannot be removed after repeated cleaning operations.

In some embodiments, in order to capture a clearer image of the surface 18B, the distance between the first device 30A and the second device 10B is adjusted. For example, the first device 30A moves toward the second device 10B to get closer to the surface 18B, as shown in FIG. 3C. FIG. 3C is a schematic diagram illustrating a capturing operation, in accordance with some embodiments. Referring to FIG. 3C, the first device 30A moves along the second direction SD toward the second device 10B. In some embodiments, the second device 10B moves toward the first device 30A while the first device 30A is kept immobile. In still some embodiments, the second device 10B moves toward the first device 30A and the first device 30A moves toward the second device 10B. Effectively, the first image capturing module 34A is able to obtain a clearer image to facilitate particle detection. Subsequently, after the adjustment, the first device 30A moves along the first direction FD and performs the cleaning and image capturing operations, as discussed in the embodiments illustrated and described with reference to FIGS. 3A and 3B.

Figure 4:
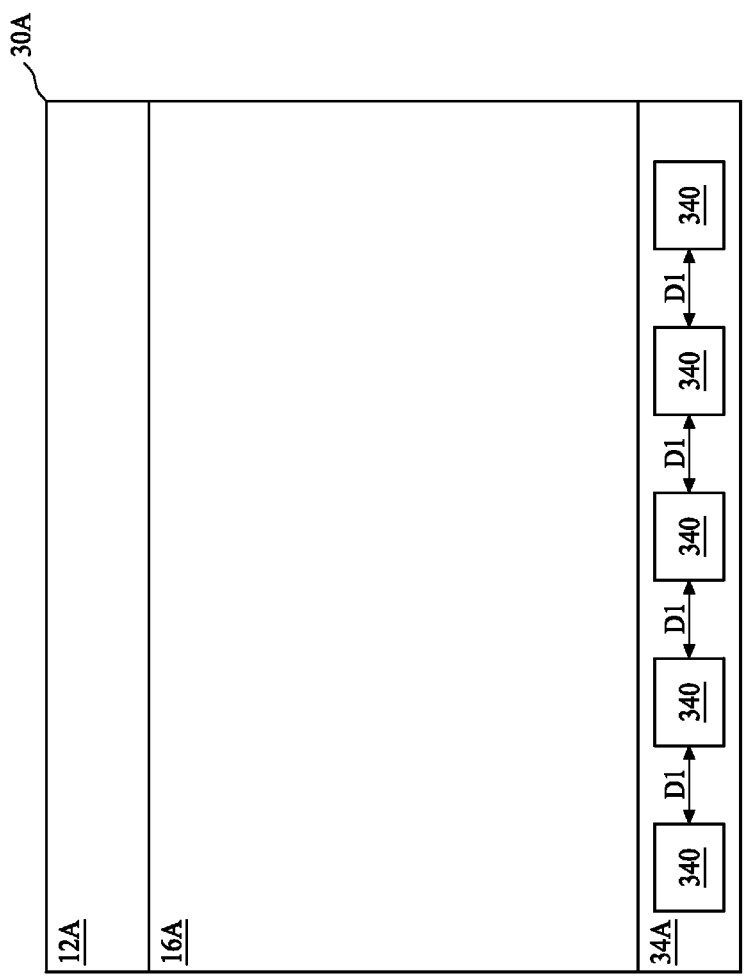
FIG. 4 is a schematic top view of the first device, in accordance some embodiments.

FIG. 4 is a schematic top view of the first device 30A, in accordance some embodiments. Referring to FIG. 4, the first image capturing module 34A includes a plurality of image capturing units 340. The image capturing units 340 function to capture an image of the surface 18B. For illustration, five image capturing units 340 are shown in FIG. 4. In the present embodiment, the image capturing units 340 are arranged in a row. Each of the image capturing units 340 is responsible for an image capturing area on the surface 18B. Moreover, the image capturing areas have substantially the same size. In order to obtain an entire image, the image capturing units 340 are spaced apart from each other by a predetermined distance D1. Such arrangement ensures that the image of the surface 18B can be effectively captured to facilitate the controller 15 to determine whether there is a particle on the surface 18B.

Figure 5:
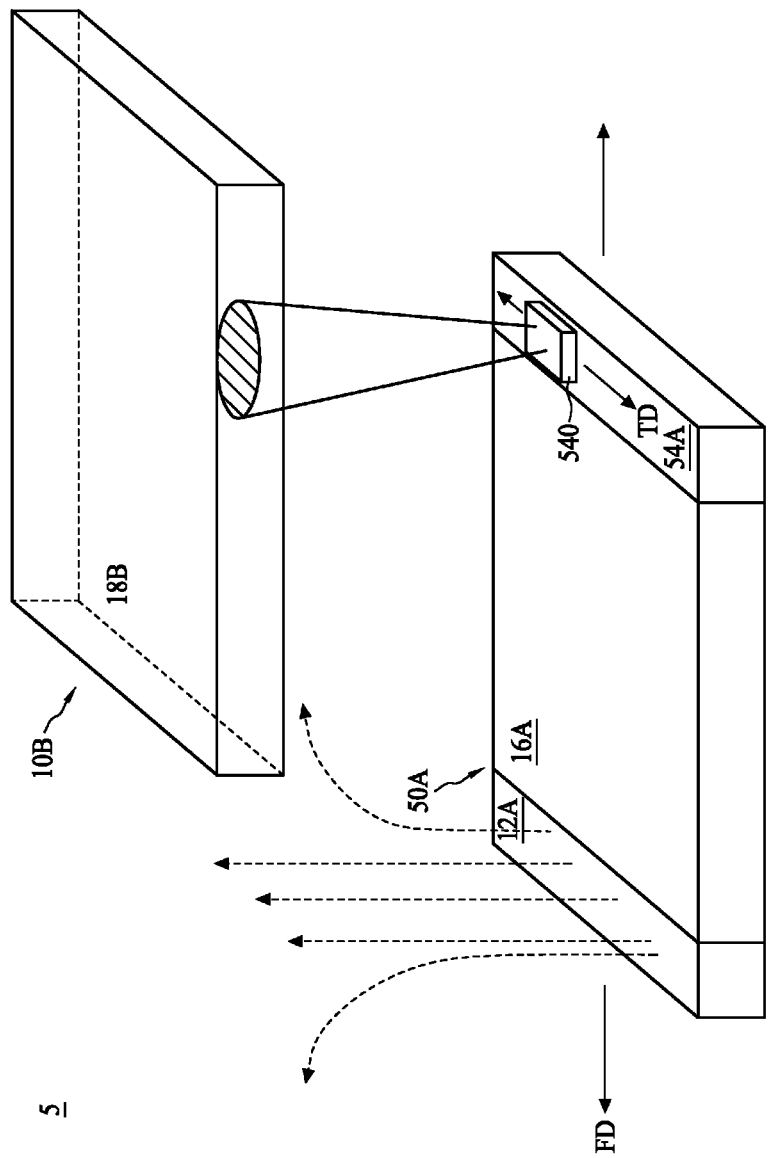
FIG. 5 is a schematic diagram of a hybrid bonding system, in accordance with some embodiments.

FIG. 5 is a schematic diagram of a hybrid bonding system 5, in accordance with some embodiments. Referring to FIG. 5, the hybrid bonding system 5 is similar to the hybrid bonding system 3 illustrated and described with reference to FIG. 3A except that, for example, the hybrid bonding system 5 includes a first device 50A. The first device 50A includes a first image capturing module 54A that includes a sub image capturing device 540. The sub image capturing device 540 is configured to be movable, back and forth, in a third direction TD, which is different from the first direction FD and the second direction SD. In some embodiments, the third direction TD is orthogonal to the first direction FD and the second direction SD. The sub image capturing device 540 is configured to capture the image of the surface 18B of the second device 10B while moving in the third direction TD. In some embodiments, the speed of the sub image capturing device 540 in the third direction TD is higher than that of the first device 50A in the first direction FD. Accordingly, as the first device 50A moves across the surface 18B along the first direction FD, the sub image capturing device 540 moving back and forth in the third direction TD is able to obtain enough image information of the surface 18B.

Figure 6:
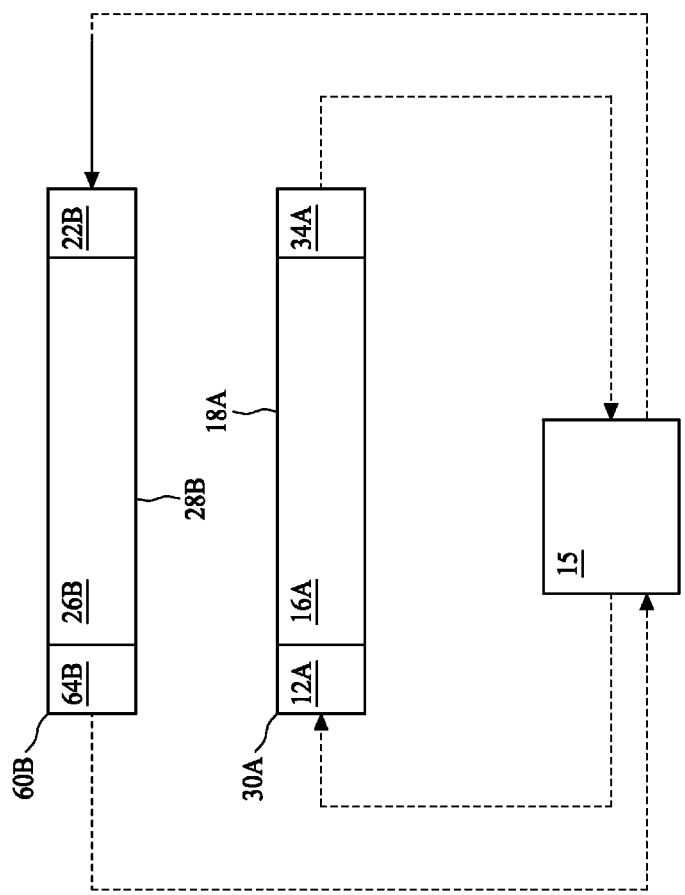
FIG. 6 is a schematic diagram of a hybrid bonding system, in accordance with some embodiments.

FIG. 6 is a schematic diagram of a hybrid bonding system 6, in accordance with some embodiments. The hybrid bonding system 6 is similar to the hybrid bonding system 2 illustrated and described with reference to FIG. 2 except that, for example, a first device 30A further includes a first image capturing module 34A, and a second device 60B further includes a second image capturing module 64B. Moreover, the second image capturing module 64B is configured to capture an image of the surface 18A in a manner similar to the first image capturing module 34A.

Furthermore, the cleaning operation performed by the second cleaning module 22B is similar to the first cleaning module 12A. For example, the second cleaning module 22B is configured to clean the surface 18A of the first device 30A while the second cleaning module 22B moves across the surface 18A in the first direction FD with respect to the first device 30A. Moreover, the second image capturing module 64B is configured to capture an image of the surface 18A of the first device while the second image capturing module 64B moves across the surface 18A in the first direction FD with respect to the first device 30A.

In some embodiments, the second device 60B keeps performing the cleaning and image capturing operations until no particle is found on the surface 18A. In this embodiment, the second image capturing module 64B is detachably mounted to the second device 60B.

In some embodiments, however, the second image capturing module 64B is independent of the second device 60B and may be discretely disposed relative to the second device 60B. The second image capturing module 64B is configured to capture the image of the surface 18A while moving across the surface 18A in the first direction FD with respect to the first device 30A.

Figure 7A:
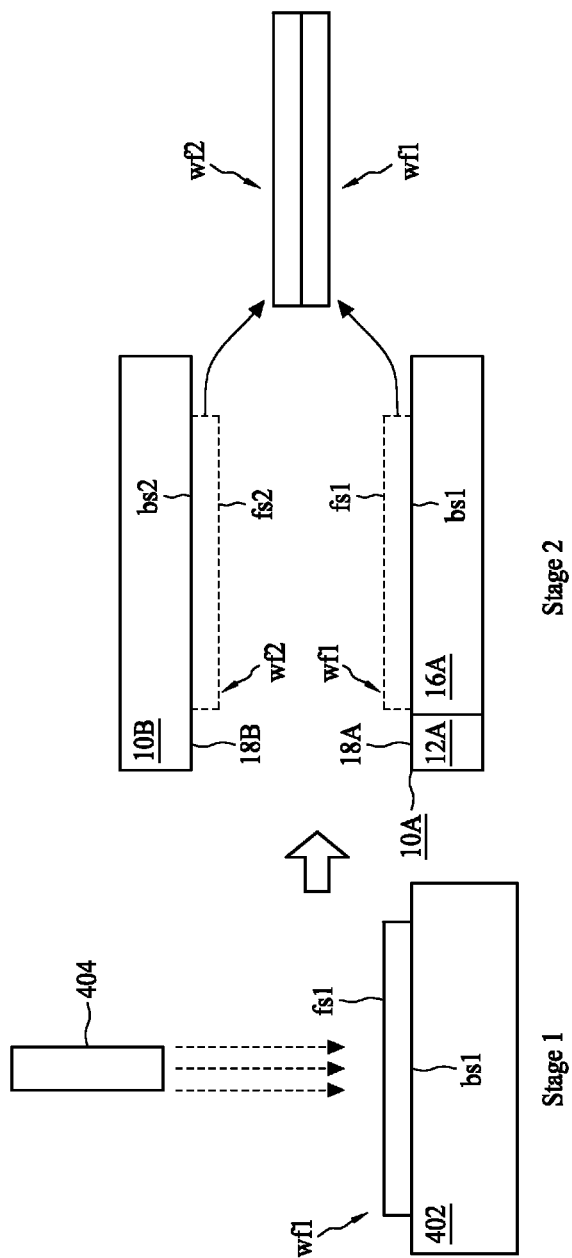
FIG. 7A is a diagram showing work flow of a hybrid bonding process, in accordance with some embodiments.

FIG. 7A is a diagram showing work flow of a hybrid bonding process, in accordance with some embodiments. Referring to FIG. 7A, the hybrid bonding process can be divided into two stages, stage 1 and stage 2. Each of the stages has its own workstation to serve its respective purpose.

In stage 1, semiconductor wafers are provided for preprocessing before wafer bonding. The preprocessing ensures the bonding surfaces of two semiconductor wafers to be free of impurity such as particle, organic or ionic contamination, and facilitates the two semiconductor wafers to bond to each other tightly.

In operation, a first semiconductor wafer wf1, having a front side fs1 and a backside bs1, is placed on a workstation 402. The front side fs1, to be bonded with another semiconductor wafer, is cleaned by a cleaning device 404 in a dry cleaning process or a wet cleaning process. For example, the cleaning device 404 may spray deionized (DI) water or cleaning solution to clean the front side fs1 of the first semiconductor wafer wf1. The temperature of the DI water has a range of, for example, approximately 70° C. to approximately 80° C. However, the backside bs1 of the first semiconductor wafer wf1 may not be cleaned and thus may be liable to contamination.

A second semiconductor wafer wf2 then goes through the same process as the first semiconductor wafer wf1. Accordingly, a front side fs2 of the semiconductor wafer wf2 is cleaned while a back side bs2 of the second semiconductor wafer wf2 may not be cleaned by the cleaning device 404. As a result, the back side bs2 may be liable to contamination.

After the semiconductor wafer surface cleaning process in stage 1, the first semiconductor wafer wf1 and the second semiconductor wafer wf2 are loaded to the first support body 16A and the second device 10B, respectively, with the front sides fs1 and fs2 facing to each other. Since the back sides bs1 and bs2 are not cleaned, when the semiconductor wafers wf1 and wf2 are loaded, particles on the back sides bs1 and bs2 may adhere to or fall on the first support body 16A and the second device 10B, respectively. Such fall-on particles, if not removed, are likely to cause bubbles in subsequent wafers, an issue called "localized defect."

In some embodiments, before loading the first semiconductor wafer wf1 and the second semiconductor wafer wf2, the first device 10A performs the cleaning operation with respect to the surface 18B to remove potential particles, as illustrated and described with reference to FIG. 1B.

In some embodiments, the first device 10A further includes an image capturing module, like the first device 30A described and illustrated with reference to FIG. 3A. In that case, before loading the first semiconductor wafer wf1 and the second semiconductor wafer wf2, the first device 10A performs the cleaning operation and the image capturing operation with respect to the surface 18B.

In some embodiments, the second device 10B further includes a cleaning module, like the second device 20B described and illustrated with reference to FIG. 2. In that case, before loading the first semiconductor wafer wf1 and the second semiconductor wafer wf2, not only the first device 10A performs the cleaning operation with respect to the surface 18B, but also the second device 10B performs the cleaning operation with respect to the surface 18A.

In some embodiments, the first device 10A further includes an image capturing module, like the first device 30A. Moreover, the second device 10B further includes a cleaning module and an image capturing module, like the second device 60B described and illustrated with reference to FIG. 6. In that case, before loading the first semiconductor wafer wf1 and the second semiconductor wafer wf2, the first device 10A performs the cleaning operation and the image capturing operation with respect to the surface 18B and the second device 10B performs the cleaning operation and the image capturing operation with respect to the surface 18A.

After cleaning the surface 18B of the second device 10B, the first semiconductor wafer wf1 is held on the first support body 16A with the front side fs1 upward, and the second semiconductor wafer wf2 is held on the second device 10B with the front side fs2 facing the front side fs1 of the first semiconductor wafer wf1. Subsequently, a bonding process is performed in stage 2. The controller 15, by controlling the first device 10A and the second device 10B, aligns the first semiconductor wafer wf1 and the second semiconductor wafer wf2 to each other. Then under the control of the controller 15 the first device 10A moves toward the second device 10B or vice versa or move together in order to bond the first semiconductor wafer wf1 and the second semiconductor wafer wf2. After the bonding process, a bonded wafer that includes the first semiconductor wafer wf1 and second semiconductor wafer wf2 is achieved. The bonded wafer is then offloaded from the second device 10B and the first support body 16A.

Figure 7B:
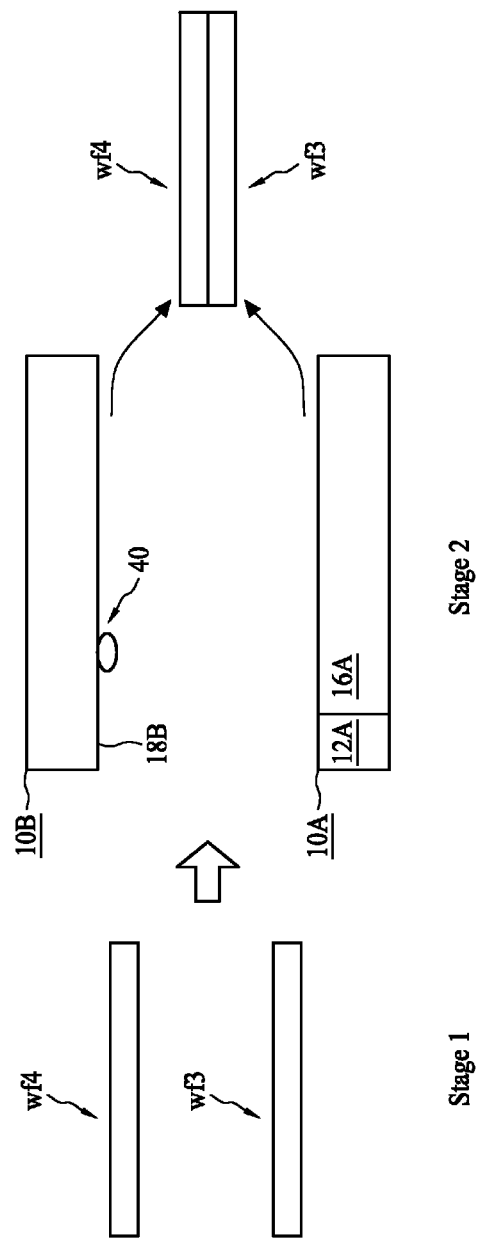
FIG. 7B is a diagram showing work flow of a hybrid bonding process, in accordance with some embodiments.

FIG. 7B is a diagram showing work flow of a hybrid bonding process, in accordance with some embodiments. Referring to FIG. 7B, after offloading the bonded wafer, it is possible that a particle 40 may exist on the surface 18B of the second device 10B. The first device 10A, under the control of the controller 15, performs the cleaning operation as discussed and illustrated with reference to FIG. 1B so as to remove the particle 40 from the surface 18B.

In some embodiments, the first device 10A further includes an image capturing module and performs the cleaning and image capturing operations with respect to the surface 18B.

In some embodiments, the second device 10B further includes a cleaning module and, while the first device 10A performs the cleaning operation with respect to the surface 18B, performs the cleaning operation with respect to the surface 18A.

In some embodiments, the first device 10A further includes an image capturing module and the second device 10B further includes a cleaning module and an image capturing module so that the first device 10A performs the cleaning and image capturing operations with respect to the surface 18B while the second device 10B performs the cleaning and image capturing operations with respect to the surface 18A.

In still some embodiments, when the bonding process in stage 2 is being performed, the semiconductor wafer surface preprocessing in stage 1 is performed at the same time. Referring to FIG. 7B, when the bonded wafer is offloaded, a third semiconductor wafer wf3 and a fourth semiconductor wafer wf4 have already been preprocessed, and are ready to be loaded to the first support body 16A and the second device 10B, respectively.

Likewise, before loading the third semiconductor wafer wf3 and the fourth semiconductor wafer wf4 to the first support body 16A and the second device 10B, the first device 10A performs the cleaning operation with respect to the surface 18B again. As a result, the fourth semiconductor wafer wf4 can be prevented from being contaminated by the potential particle 40.

The hybrid bonding system according to the abovementioned embodiments of the present disclosure is advantageous in that semiconductor wafers to be bonded can be effectively prevented from being contaminated by particles. Alien materials like particles or dust on the surface 18A or 18B, if not properly removed, may adversely affect not only the current semiconductor wafers being bonded but also subsequent semiconductor wafers to be bonded. With the first cleaning module 12A, particles are expected to be removed from the surface 18B. Moreover, with the first image capturing module 34A as illustrated in FIG. 3A for checking the cleaning status, repeated cleaning operations may be performed, if necessary, which further ensures the removal of the particle. As a result, unless there is the case that a particle is still not removed after repeated cleaning, the bonding process needs not stop for manual inspection. Effectively, the hybrid bonding system according to the disclosure achieves in-situ particle detection and removal.

In some existing approaches, a chuck like the second device 10B or the first support body 16A is used in a hybrid bonding process to support a semiconductor wafer, and facilitates bonding the semiconductor wafer to another one. During the bonding process, it may be required to check whether a localized defect exists at the bonded semiconductor wafer by visual inspection, for example, by way of a monitor. Since the hybrid bonding process keeps running, while the currently bonded semiconductor wafer is inspected, subsequent semiconductor wafers are being bonded or ready to be bonded. Therefore, when the localized defect is found, a lot of bonded semiconductor wafers have been contaminated. Consequently, a significant number of semiconductor wafers are wasted because the existing approaches fail to catch the defect in real time. Moreover, manual operation is required to maintain the cleanliness of chuck surface. Additionally, the semiconductor wafer surface preprocessing and the bonding process have to be paused until the particle is removed.

Figure 8:
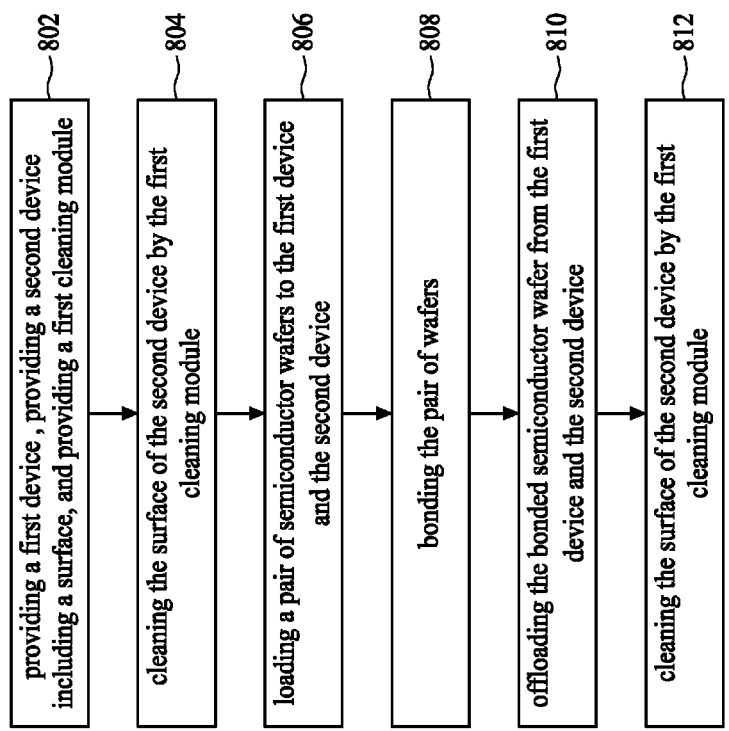
FIG. 8 is a flow diagram illustrating a method of a hybrid bonding process, in accordance with some embodiments.

FIG. 8 is a flow diagram illustrating a method of a hybrid bonding process, in accordance with some embodiments. Referring to FIG. 8, in operation 802, also referring to FIG. 1A, a first device, a second device and a first cleaning module are provided. Moreover, the second device has a surface facing the first cleaning module.

In operation 804, also referring to FIG. 1B, the surface of the second device is cleaned by the first cleaning module as the first cleaning module moves relative to the second device in a first direction.

In operation 806, also referring to FIG. 7A, a pair of semiconductor wafers is loaded to the first device and the second device and then are bonded to each other in operation 808.

Subsequently, in operation 810, also referring to FIG. 7A, the bonded semiconductor wafer is offloaded from the first device and the second device.

Next, in operation 812, the surface of the second device is cleaned by the first cleaning module.

Figure 9:
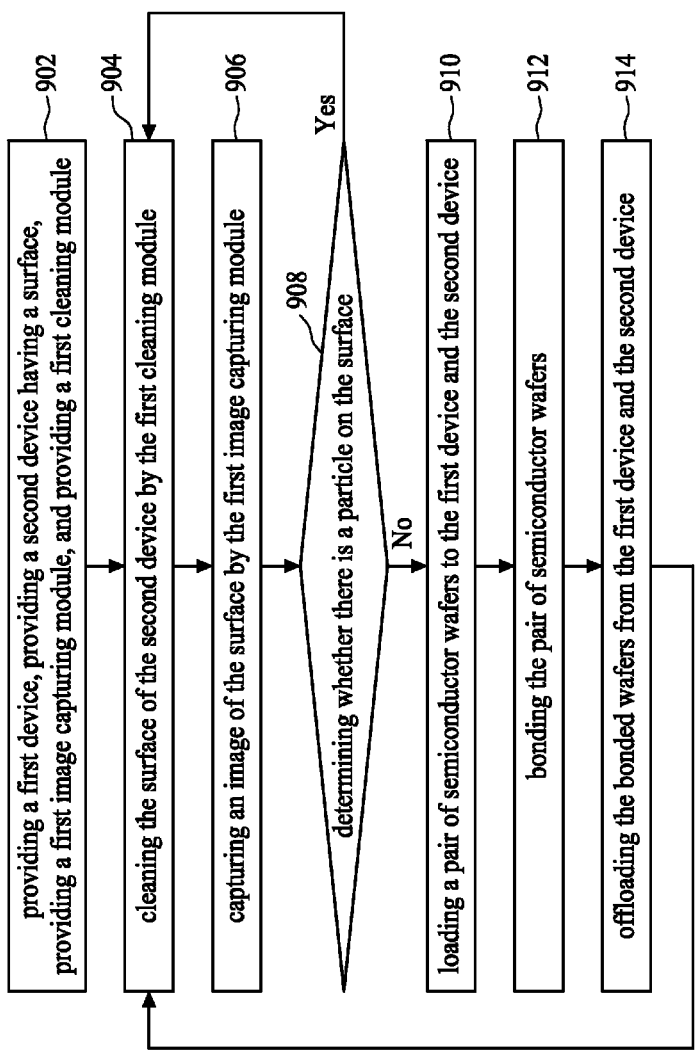
FIG. 9 is a flow diagram illustrating a method of a hybrid bonding process, in accordance with some embodiments.

FIG. 9 is a flow diagram illustrating a method of a hybrid bonding process, in accordance with some embodiments. Referring to FIG. 9, in operation 902, also referring to FIG. 3A, a first device, a second device, a first cleaning module and a first image capturing module are provided. Moreover, the second device has a surface facing the first cleaning module and the first image capturing module.

In operation 904, also referring to FIG. 3B, the surface of the second device is cleaned by the first cleaning module. Next, in operation 906, an image of the surface of the second device is taken by the first image capturing module.

In operation 908, it is determined whether there is a particle on the surface based on the captured image. If affirmative, operations 904, 906 and 908 are repeated. If not, in operation 910, also referring to FIG. 7A, a pair of semiconductor wafers is loaded to the first device and the second device. The pair of semiconductor wafers is then bonded to each other in operation 912.

Subsequent to operation 912, in operation 914, referring to FIG. 7B, the bonded wafer is offloaded from the first device and the second device. Next, operations 904, 906 and 908 are repeated to clean the surface of the second device and determine whether the surface after cleaning is clean enough for wafer bonding.

Figure 10:
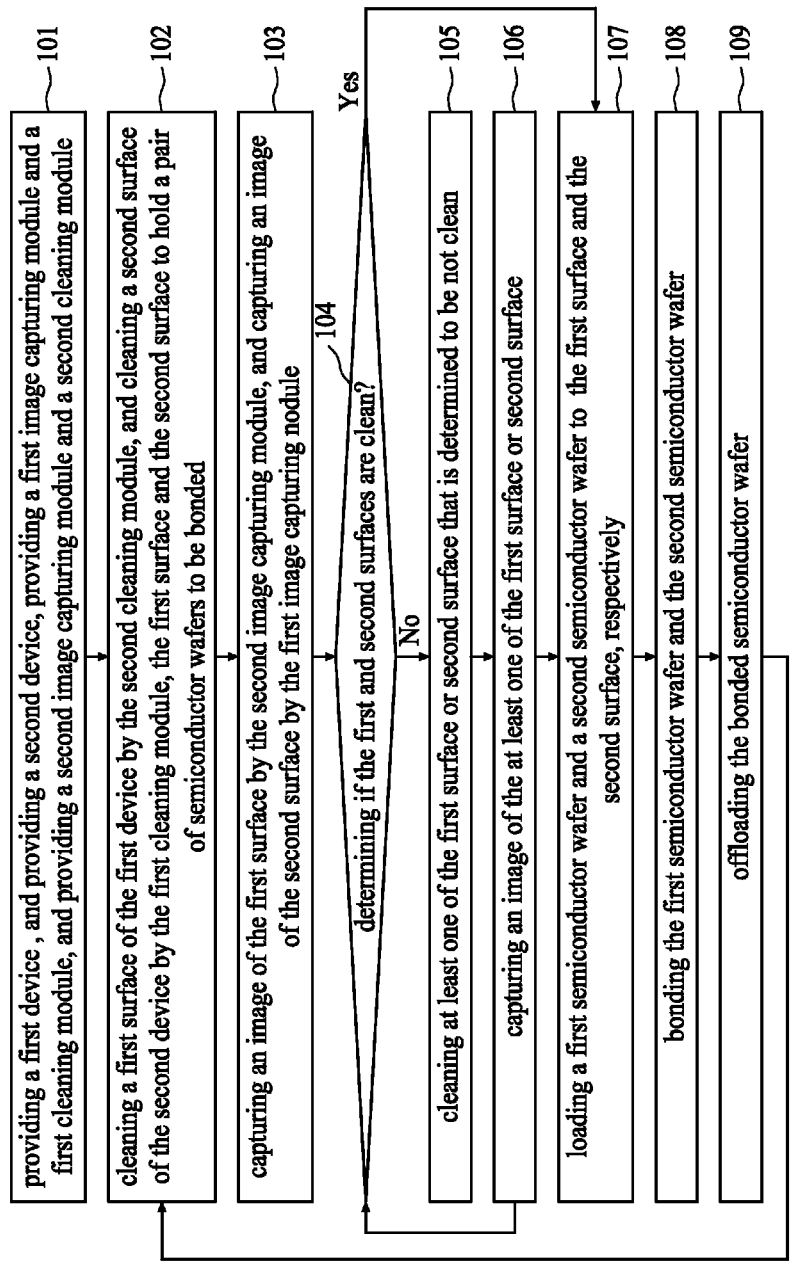
FIG. 10 is a flow diagram illustrating a method of a hybrid bonding process, in accordance with some embodiments.

FIG. 10 is a flow diagram illustrating a method of a hybrid bonding process, in accordance with some embodiments. Referring to FIG. 10, in operation 101, also referring to FIG. 6, a first device, a second device are provided, a first cleaning module, a first image capturing module, a second cleaning module and a second image capturing module are provided.

In operation 102, a first surface of the first device is cleaned by the second cleaning module, and a second surface of the second device is cleaned by the second cleaning module. The first surface and the second surface face to each other and function to hold a pair of semiconductor wafers.

Next, in operation 103, an image of the first surface is taken by the second image capturing module, and an image of the second surface is taken by the first image capturing module. The images are then sent to a controller for analysis.

In operation 104, it is determined whether the first surface and the second surface are clean. If the first surface is not clean, in operation 105, the first surface is cleaned again by the second cleaning module, and in operation 106 an image of the first surface after the cleaning operation in operation 105 is taken by the second image capturing module. If the second surface is not clean, in operation 105, the second surface is cleaned again by the first cleaning module, and, in operation 106, an image of the second surface after the cleaning operation in operation 105 is taken by the first image capturing module. Operations 104, 105 and 106 are repeated until both the first and second surfaces are determined to be clean.

In some embodiments, if any one of the first surface and the second surface is determined to be not clean, operations 102, 103 and 104 are repeated. Accordingly, operations 105 and 106 can be eliminated.

Subsequent to operation 104, if both the first and second surfaces are determined to be clean, in operation 107, a pair of semiconductor wafers, for example, a first semiconductor wafer and a second semiconductor wafer, is loaded onto the first surface and the second surface, respectively.

Next, the first semiconductor wafer and the second semiconductor wafer are bonded to each other in operation 108, resulting in a bonded semiconductor wafer. The bonded semiconductor wafer is then offloaded from the first device and the second device in operation 109. Subsequently, operations 102 to 109 are repeated for another pair of semiconductor wafers including, for example, a third semiconductor wafer and a fourth semiconductor wafer.

In some embodiments, while a first pair of semiconductor wafers is preprocessed to ensure cleanliness of their bonding surfaces, the first surface and the second surface undergo the cleaning process in operation 102. After the bonded semiconductor wafer including the first pair of semiconductor wafers is offloaded in operation 109, a second pair of semiconductor wafers is preprocessed while the first surface and the second surface undergo the cleaning process. There is no need to stop the semiconductor wafer preprocessing and device surface cleaning operation unless a particle is found difficult to remove. Effectively, an in-situ defect detection and removal system and method are achieved.

Some embodiments have one or a combination of the following features and/or advantages. In some embodiments, a hybrid bonding system includes a first device, a second device and a first cleaning module. The first device is configured to load a first semiconductor wafer. The second device is configured to be movable with respect to the first device in a first direction. The second device has a second surface facing the first device. The second surface is configured to load a second semiconductor wafer. The first cleaning module is configured to clean the second surface of the second device while moving across the second surface in the first direction with respect to the second device.

In some embodiments, in a method, a first device, a second device and a first cleaning module are provided. The first device has a first surface configured to load a first semiconductor wafer. The second device has a second surface configured to load a second semiconductor wafer. The second surface is cleaned by moving the first cleaning module across the second surface in a first direction with respect to the second device.

In some embodiments, in a cleaning method in a hybrid bonding system, a first device and a second device are provided. The first device has a first surface configured to load a first semiconductor. The second device has a second surface configured to load a second semiconductor wafer. The first surface and the second surface face to each other. The first and second semiconductor wafers are preprocessed. At least one of the first or the second surface is cleaned when the first and second semiconductor wafers are preprocessed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning an apparatus for processing a semiconductor wafer, the method comprising:
   providing a first device having a first surface configured to load a first semiconductor wafer, a second device having a second surface configured to load a second semiconductor wafer, and a first cleaning module; and
   cleaning the second surface by moving the first cleaning module across the second surface in a first direction with respect to the second device,
   wherein the second surface is cleaned before the second device loads the second semiconductor wafer on its second surface.

2. The method as claimed in claim 1, wherein the providing the first device, the second device and the first cleaning module further comprises providing a second cleaning module, the method further including:
   cleaning the first surface of the first device by moving the second cleaning module across the first surface in the first direction with respect to the first device.

3. The method as claimed in claim 1, wherein the providing the first device, the second device and the first cleaning module further comprises providing a first image capturing module, the method further including:
   capturing an image of the second surface of the second device by moving the first image capturing module across the second surface in the first direction with respect to the second device.

4. The method as claimed in claim 3, wherein the cleaning the second surface further comprises:
   cleaning the second surface by the first cleaning module until the image indicates that no particle is found on the second surface.

5. The method as claimed in claim 3, wherein the providing the first device, the second device, the first cleaning module, the second cleaning module and the first image capturing module further comprises providing a second image capturing module, the method further including:
   capturing an image of the first surface of the first device by moving the second image capturing module across the first surface in the first direction with respect to the first device; and
   cleaning at least one of the first surface or the second surface which is determined to be not clean by the first cleaning module or the second cleaning module until the at least one of the first surface or the second surface is cleaned.

6. A method of cleaning an apparatus for processing a semiconductor wafer, the method comprising:
   providing a first device having a first surface configured to load a first semiconductor wafer, a second device having a second surface configured to load a second semiconductor wafer, the first surface and the second surface facing each other, and a first cleaning module;
   preprocessing the first semiconductor wafer and the second semiconductor wafer; and
   cleaning the second surface by moving the first cleaning module across the second surface in a first direction with respect to the second device when preprocessing the first semiconductor wafer and the second semiconductor wafer.

7. The method as claimed in claim 6, further comprising:
   cleaning the second surface before loading the preprocessed first semiconductor wafer and the preprocessed second semiconductor wafer on to the first surface and the second surface.

8. The method as claimed in claim 6, further comprising:
   cleaning the second surface after offloading a bonded semiconductor wafer including the preprocessed first semiconductor wafer and the preprocessed second semiconductor wafer from the first surface and the second surface and when preprocessing a third semiconductor wafer and a fourth semiconductor wafer.

9. The method as claimed in claim 6, further comprising:
   capturing an image of the second surface when preprocessing the first and second semiconductor wafers; and
   cleaning the second surface until the image indicates no particle is found on the second surface.

10. The method as claimed in claim 9, further comprising:
    capturing the image of the second surface before loading the preprocessed first semiconductor wafer and the preprocessed second semiconductor wafer on to the first surface and the second surface.

11. The method as claimed in claim 9, further comprising:
    capturing the image of the second surface after offloading a bonded semiconductor wafer including the preprocessed first semiconductor wafer and the preprocessed second semiconductor wafer from the first surface and the second surface and when preprocessing a third semiconductor wafer and a fourth semiconductor wafer.

12. The method as claimed in claim 6, further comprising:
    providing a second cleaning module; and cleaning the first surface by moving the second cleaning module across the first surface in the first direction with respect to the first device when preprocessing the first semiconductor wafer and the second semiconductor wafer.

13. The method as claimed in claim 6, further comprising:
providing a first image capturing module; and
capturing an image of the second surface of the second device by moving the first image capturing module across the second surface in the first direction with respect to the second device.

14. The method as claimed in claim 13, further comprising:
capturing the image of the second surface of the second device by moving the first image capturing module along a second direction different from the first direction.

\* \* \* \* \*